United States Patent [19]

Ta

[11] Patent Number: 4,962,323
[45] Date of Patent: Oct. 9, 1990

[54] HIGH SPEED AUTO ZERO COMPARATOR

[75] Inventor: Paul D. Ta, Sunnyvale, Calif.

[73] Assignee: National Semiconductor Corporation, Santa Clara, Calif.

[21] Appl. No.: 379,577

[22] Filed: Jul. 12, 1989

[51] Int. Cl.⁵ ............................................. H03K 5/24
[52] U.S. Cl. ................................... 307/350; 307/355; 307/491; 307/494
[58] Field of Search ............ 307/350, 355, 572, 296.2, 307/490, 491, 494

[56] References Cited

U.S. PATENT DOCUMENTS

| | | |
|---|---|---|
| 3,585,510 | 6/1971 | O'Malley . |
| 3,655,996 | 4/1972 | Takahashi ........................ 307/572 |
| 4,163,947 | 8/1979 | Weedon . |
| 4,417,160 | 11/1983 | Schade, Jr. . |
| 4,472,648 | 9/1984 | Prentice ........................... 307/491 |
| 4,513,212 | 4/1985 | Money . |
| 4,542,305 | 9/1985 | Blauschild . |
| 4,587,443 | 5/1986 | van de Plassche . |
| 4,665,326 | 5/1987 | Domogalla . |
| 4,725,813 | 2/1988 | Miyada ............................. 307/572 |
| 4,739,192 | 4/1988 | Price, Jr. . |
| 4,775,807 | 10/1988 | Bukowski, Jr. .................... 307/491 |

FOREIGN PATENT DOCUMENTS 0015554 3/1980 European Pat. Off. .
233898A1 10/1981 Fed. Rep. of Germany .

OTHER PUBLICATIONS

Pleshko et al., "MOS Transistor Electronic Stabilization of Thresholds," *IBM Technical Disclosure Bulletin* vol. 10, No. 3 Aug. 1967, pp. 336–337.

Primary Examiner—John Zazworsky
Attorney, Agent, or Firm—Steven F. Caserza

[57] ABSTRACT

In accordance with the teachings of this invention, a novel auto-zero comparator is provided in which the on resistance of MOS switches serving as transfer gates used in the auto-zero mode to connect the output lead to the input lead is minimized without the need to increase the width to length ratio of the MOS switches. In accordance with the teachings of this invention, the on resistance of the transfer gates is reduced by reducing the threshold voltage of the transfer gates, which in turn is accomplished by making the bulk to source voltage of the transfer gates equal to zero. This is accomplished by utilizing a replica bias circuit which, during the auto-zero mode, replicates the voltage on the source of the transfer gates and applies this replica bias voltage to the bulk of the transfer gates.

4 Claims, 2 Drawing Sheets

HIGH SPEED AUTO ZERO COMPARATOR

BACKGROUND

This invention pertains to electronic circuits and more particularly to high speed auto zero comparators used in charge balancing approximation A/D converters. The circuits of this invention are capable of operating at high speed in the auto zero mode to cancel the first order of offset voltage prior to performing comparisons.

One example of a prior art comparator circuit is shown in FIG. 1. Comparator circuit 10 of FIG. 1 is formed of three comparators 11, 12, and 13 connected in cascade to provide greater gain with minimal delay time. Two input signals to be compared are applied to non-inverting input lead 101 and inverting input lead 102 which are then capacitively coupled via capacitors 115 and 116 to non-inverting input lead 111 and inverting input lead 112, respectively, of comparator 11. Comparator 11 provides a complementary output signal on inverting output lead 113 and non-inverting output lead 114 which are capacitively coupled via capacitors 125 and 126 to non-inverting input lead 121 and inverting input lead 122, respectively, of comparator 12. The complementary output signals on output leads 123 and 124 of comparator 12 are similarly capacitively coupled to the input leads of comparator 13, and the differential output signals from comparator 13 are provided on output terminals 103 and 104.

Each comparator 11, 12, and 13 have associated switches 117, 118; 127, 128; 137, 138 which serve to connect the inverting output lead of a comparator to its non-inverting input lead, and its non-inverting output lead to its inverting input lead during an auto-zero mode of operation.

The substrates of switches 117, 118, 127, 128, 137, 138 are connected to ground. In charge balancing successive approximation A/D conversion, during phase one of the clock, VIN and VREF voltages are sampled on input terminals 101, 102 of capacitors 115 and 116, respectively. At the same time, switches 117, 118, 127, 128, 137, and 138 are turned on, which puts the comparators in the auto zero mode. The effective input referred offset voltage which is stored at node 111 and 112 is $$VOS = \frac{V_{OS1}}{G_1} + \frac{V_{OS2}}{G_1 G_2} + \frac{V_{OS3}}{G_1 G_2 G_3}$$

VOS2 VOS3
VOS1 + +G G G
VOS =G1 G1G2 1 2 3
where $V_{OS1}$, $V_{OS2}$, $V_{OS3}$ and $G_1$, $G_2$, $G_3$ are the intrinsic offset voltages and gains of comparators 11, 12, 13, respectively.

During phase two of the clock, switches 117, and 118 are opened first, then switches 127 and 128 are opened, then switches 137 and 138 are opened, and then node 101 is connected to VREF/2; node 102 is always kept at VREF. The order of switching sequence serves to minimize the effective residual offset voltage and imbalanced charge injection seen at nodes 111 and 112. Thus, VIN is compared with VREF/2 while VOS is kept at minimum.

For phase one of next clock cycle, VIN and VREF are again sampled on capacitors 115 and 116, respectively, and in phase two VIN is compared with VREF/4 or with 3VREF/4, depending on the previous result. For completeness, comparator 10 is usually followed by a clocked regeneration latch (not shown) which converts the analog signal at output nodes 103 and 104 to digital levels which are subsequently stored in a register (not shown). For an n bit A/D converter, n cycles conversion time is required.

To reduce conversion time, a cascade of comparators as described above can be used to minimize the time required to complete phase two. To minimize the time required to complete phase one without losing accuracy, the novel high speed auto zero technique of this invention is incorporated in the comparator design.

FIG. 2 is a schematic diagram of a typical comparator which may be used as comparators 11, 12, and 13 of FIG. 1. Reference numerals in FIG. 2 are shown referred to comparator 11 of FIG. 1. As shown in FIG. 2, comparator 11 includes non-inverting input terminal 111 and inverting input terminal 112. Comparator 11 of FIG. 2 is shown in the auto-zero mode. For AC analysis, input capacitors 115 and 116 are shown connected from input nodes 111 and 112, respectively, to ground. Comparator 11 also includes inverting output terminal 113, and non-inverting output terminal 114. Output load capacitances 125 and 126 are shown connected between output terminals 113 and 114, respectively, and ground. Switch 117 is provided by transistor M4A, having current handling terminals connected between inverting output terminal 113 and non-inverting input terminal 111. Similarly, switch 118 is provided by transistor M4B having its current handling terminals connected between non-inverting output terminal 114 and inverting input terminal 112. Transistors M2A and M2B provide a differential transistor pair having their sources connected in common to current source I2 and their drains connected to load devices M1A and M1B, respectively. Connected to the drain of transistor M2A is parasitic capacitance 413A, which is due to the drain junctions of transistors M1A and M2A, and the gate of transistor M3A. Connected to the drain of transistor M2B is parasitic capacitance 413B, which is due to the drain junctions of transistors M1B and M2B, and the gate of transistor M3B. Transistors M3A and M3B serve as source followers connecting the drains of differential transistors M2A and M2B to output terminals 113 and 114, respectively. Current sources I1 and I3 serve as pull down loads for transistors M3A and M3B, respectively.

Unfortunately, the prior art circuit of FIG. 2 is unstable during the auto-zero mode of operation, causing its voltages not to settle to 0.2% or better for an 8 bit A/D converter and higher accuracy converter during the auto-zero mode. The gain of comparator 11 is $$G \approx -g_{M2A} R_{out} \text{ where} \tag{1}$$

$G$ = the gain of comparator 11;
$g_{M2A}$ = is the transconductance of transistor $M2A$; and $$R_{out} = \frac{1}{g_{dsM1A} + g_{dsM2A}} ; \text{ where}$$

$g_{dsM1A}$ = the conductance of transistor $M1A$; and
$g_{dsM2A}$ = the conductance of transistor $M2A$.

G the gain of comparator 11;
gM2A =is the transconductance of transistor M2A; and
Rout =gdsM1A +gdsM2A; where gdsM1A = the conductance of transistor M1A; and
gdsM2A = the conductance of transistor M2A.

The dominant pole of comparator 11 is $$p_d = -\frac{1}{C_{3A}R_{out}}; \text{ where} \quad (2)$$

$p_d$ = the dominant pole; and
$C_{3A} = C_{jdbM1A} + C_{jdbm2A} + C_{gM3a}$; where
the drain-to-bulk junction
$C_{jdb}$ = capacitance of an MOS transistor; and
$C_g$ = the gate capacitance of an MOS transistor.

Pd =- C Rout; where (2)
3A
Pd the dominant pole; and C3A CjdbM1A +CjdbM2A +CgM3A; where
Cjdb = the drain-to-bulk junction capacitance of an MOS transistor; and
Cg = the gate capacitance of an MOS transistor.

The unity frequency $P_u$, i.e. the frequency where the gain is equal to one is $$P_u = G \cdot P_d \quad (3)$$

Then combining equations 1, 2, and 3:

$$P_u = -\frac{g_{M2A}}{C_{3A}} \quad (4)$$

gM2A Pu =- C (4)
3A

The non-dominant poles are $$P_{nd1} \approx -\frac{g_{M3A}}{C_{1A}}, \text{ and} \quad (5)$$

$$P_{nd2} \approx -\frac{1}{C_{2A}R_{on}}; \text{ where} \quad (6)$$

$P_{nd1}$ = the first non-dominant pole;
$P_{nd2}$ = the second non-dominant pole;
$g_{m3A}$ = the transconductance of transistor M3A;
$C_{1A} = C_{125} + C_{jsbM3A}$, the capacitance of capacitor 125 plus the junction capacitance at the source of transistor M3A;
$C_{2A} = C_{115} + C_{jsbM4} + C_{gM2A}$, the capacitance of input coupling capacitor 115 plus the junction capacitance at source of transistor M4A plus the gate capacitance of transistor M2A;
$R_{on}$ = the on resistance of transmission gate M4A.

gM3A Pnd1 - C (5)
1A , and
; where (6) Pnd2 - C Ron
2A Pnd1 = the first non-dominant pole; Pnd2 the second non-dominant pole; gm3A the transconductance of transistor
M3A; C1A C125 +CjsbM3A, the capacitance of capacitor 125 plus the junction capacitance at the source of transistor M3A; C2A =C115 +CjsbM4 +CgM2A, the capacitance of input coupling capacitor 115 plus the junction capacitance at source of transistor M4A plus the gate capacitance of transistor M2A; Ron = the on resistance of transmission gate M4A.

It is well known that the necessary condition for comparator 11 in the auto-zero mode to be stable is $$P_{nd2} > 1.7 P_u \quad (7)$$

Combining equation 7 with equations 6 and 4 gives $$\frac{1}{C_{2A}R_{on}} \gtrsim 1.7 \frac{g_{M2A}}{C_{3A}} \quad (8)$$

gM2A
1 >
(8)
C2ARon 1.7 C3A
which yields $$\frac{1}{g_{M2A}R_{on}} \gtrsim 1.7 \frac{C_{2A}}{C_{3A}} \quad (9)$$

C2A
1 >
(9)
1.7 C3A
W
Thus $$\left(\frac{W}{L}\right)_{M4A},$$

the ratio of the channel width to channel length of transmission gate M4A, must be made large since its on resistance $R_{on}$ is proportional to its channel length and inversely proportional to its channel width. Unfortunately, increasing the ratio of the channel width to channel length of transmission gate M4A results in a large charge injection into node 111 and node 112 after switching off transmission gates M4A and M4B, thereby reducing the accuracy of the comparator.

Furthermore, comparator 11 is not very effective at operating at low supply voltages and at high temperature because $R_{on}$ of transistor M4A is increased with lower supply voltages and with increasing temperature (i.e. transistor M4A is not turned on as hard).

Other prior art is known. U.S. Pat. No. 4,513,212 describes a circuit for automatically clamping the P wells of a CMOS integrated circuit to the most negative potential of the integrated circuit as a whole. U.S. Pat. No. 4,665,326 describes a voltage comparator including offset correction circuits including a digital to analog converter error register for providing correction voltages to a set of capacitors contained within the error circuit. U.S. Pat. No. 4,417,160 describes a comparator including offset compensation in which a potential offset means is included in the auto-zero feedback loop having an offset comparable to the input offset of the threshold detector, thereby allowing the offset correction voltage to track the input offset voltage over time and temperature. U.S. Pat. No. 4,587,443 describes an auto-zero sample and hold circuit including switches for, during the hold period, minimizing the effect of offset voltages by connecting the output of the comparator to its input and reversing the interstage connections between two cascaded differential amplifiers. Patentscrift DD. No. 233898A1 describes a comparator including a feedback loop between the output of the comparator and the input of the first amplifier. Offset is further reduced by the use of a dummy transistor. European Patent Application No. 001 555 4A1 describes a comparator circuit including switch means for shorting out the differential input leads prior to reading an input signal. U.S. Pat. No. 3,585,510 pertains to a comparator circuit and more particularly the threshold setting circuit connected to the input leads of the comparator circuit. The threshold voltage is maintained at a desired level regardless of changes in the duty cycle of an AC input signal. U.S. Pat. No. 4,163,947 describes an auto-zeroing integrator in which, during an auto-zero mode, the current flowing into the input of the integrator is measured and a charge is stored which thereafter provides an equal but opposite current to the input of the integrator. U.S. Pat. No. 4,542,305 pertains to an impedance buffer, and U.S. Pat. No. 4,739,192 pertains to a digital to analog converter bit switch. "MOS Transistor Electronic Stablization of Thresholds," IBM Technical Disclosure Bulletin, Vol. 10, #3, August 1967, pp. 336–337 describes a circuit for allowing a first transistor to provide a bias current to a second transistor, with the current flowing through the second transistor setting the level of the substrate voltage of the second transistor. This substrate voltage is maintained relatively constant over a wide number of devices, regardless of process variations and the like. This allows a large number of devices to be manufactured having similar threshold voltage levels, regardless of process variations.

SUMMARY

In accordance with the teachings of this invention, a novel auto-zero comparator is provided in which the on resistance of MOS switches serving as transfer gates used in the auto-zero mode to connect the output lead to the input lead is minimized without the need to increase the $$\left(\frac{W}{L}\right)$$

ratio of the MOS switches. In accordance with teachings of this invention, the on resistance of the transfer gates is reduced by reducing the threshold voltage of the transfer gates, which in turn is accomplished by making the bulk to source voltage of the transfer gates equal to zero. This is accomplished by utilizing a replica bias circuit which, during the auto-zero mode, replicates the voltage on the source of the transfer gates and applies this replica bias voltage to the bulk of the transfer gates.

DETAILED DESCRIPTION

Figure 1:
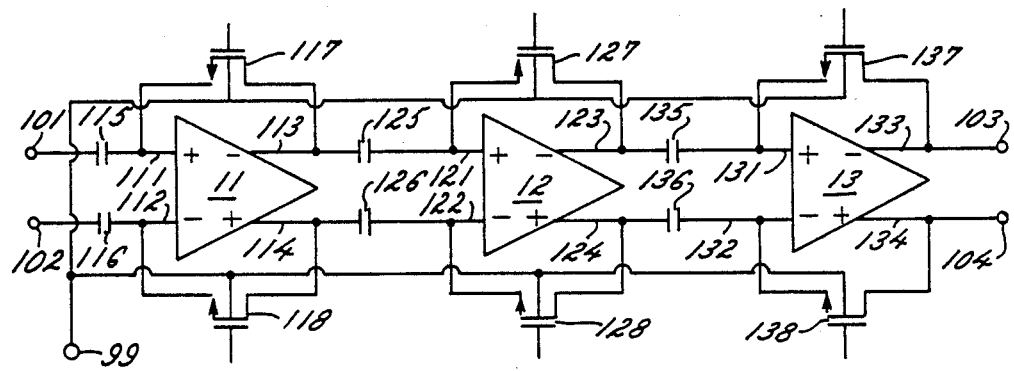
FIG. 1 is a schematic diagram of a prior art auto-zero comparator.
Figure 2:
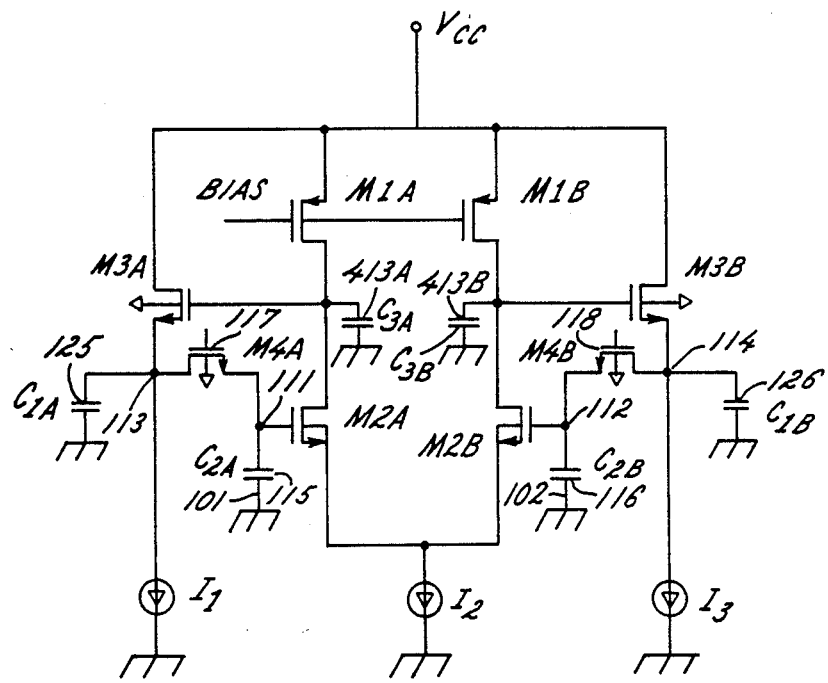
FIG. 2 is a schematic diagram of a typical prior art comparator which is connected as it would be used in an auto-zero mode.
Figure 3:
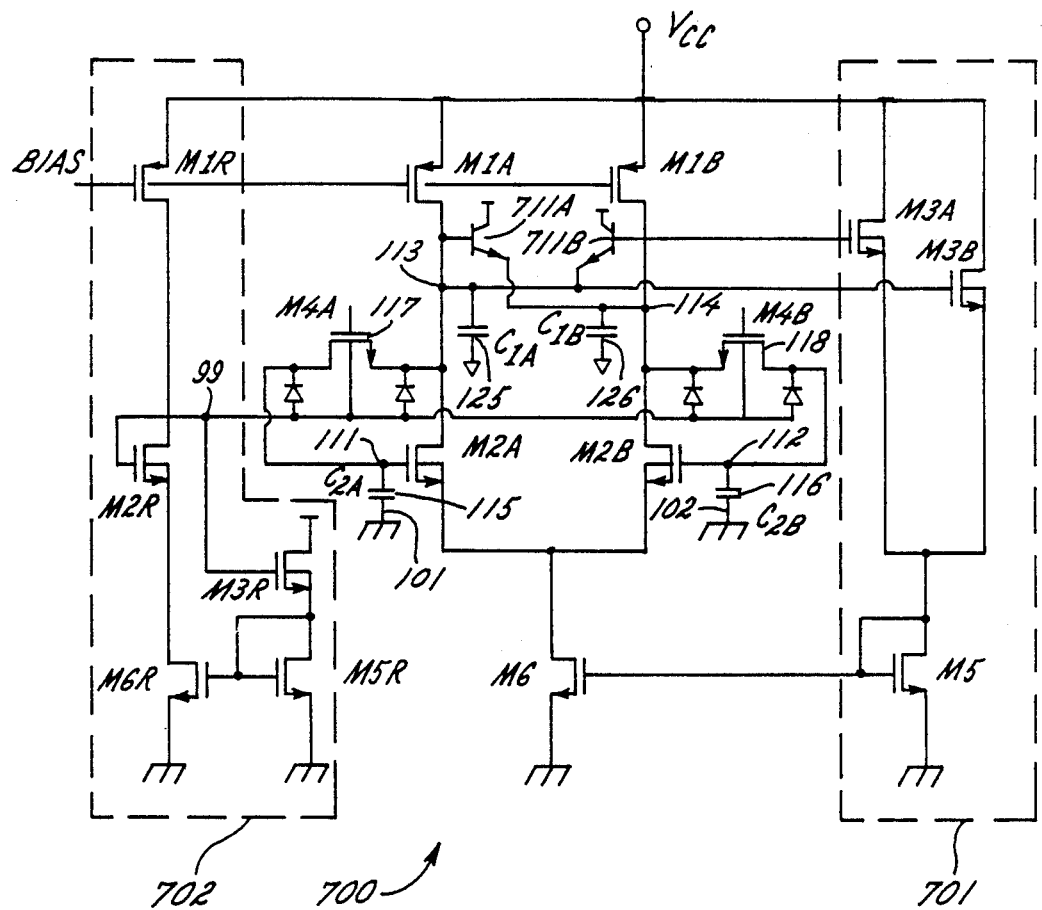
FIG. 3 is a schematic diagram of one embodiment of a comparator circuit constructed in accordance with the teachings of this invention connected as it would be in the circuit of FIG. 1 during the auto-zero mode.

FIG. 3 is a schematic diagram of one embodiment of a comparator constructed in accordance with the teachings of this invention. Comparator 700, shown connected in the auto-zero mode, includes differential transistor pair M2A and M2B, and load devices M1A and M1B, as in the prior art circuit of FIG. 2. A non-inverting input leg is formed including non-inverting input transistor M2A having its gate serving as non-inverting input lead 111, load device M1A, and inverting output terminal 113. Similarly, an inverting input leg is formed including inverting input transistor M2B having its gate serving as inverting input lead 112, load device M1B, and non-inverting output terminal 114. Transistor M6 serves as a current source, analogous to current source I2 of the prior art circuit of FIG. 2. Comparator 700 also includes common mode feedback circuit 701, as is known in the prior art, which operates to set the output voltage of comparator 700 by feedback controlling current source M6. The differential output voltage from inverting and non-inverting output terminals 113 and 114, respectively, are applied to the gates of transistors M3A and M3B, respectively, thereby controlling the current flow through load device M5. The current flowing through load device M5 is mirrored by current source M6, thereby affecting the level of the output voltage on output terminals 113 and 114. This feedback loop assures a desired quiescent operating point for the differential output voltage, regardless of variations in temperature, power supply, voltage level, and the like.

Transistor 711A and 711B are vertical NPN transistors and serve as a differential voltage clamp; thus limiting the differential output voltage swing to one diode drop. This helps to speed up the time for the circuit during the auto-zero node of operation.

In accordance with the teachings of this invention, switches 117 and 118 are formed as transistors M4A and M4B, respectively, serving as transmission gates connected between inverting output lead 113 and non-inverting input lead 111, and non-inverting output lead 114 and inverting lead 112, respectively. Of importance, the substrates of transistors M4A and M4B are not connected to ground, but rather are connected to node 99 within a replica bias circuit 702 such that the voltage on the substrates of transistors M4A and M4B (which in one embodiment comprise one or more P wells in an N-type wafer) are set to equal the output voltages on output terminals 113 and 114. This is accomplished by utilizing replica bias circuit 702 having transistor M1R connected to mirror the current flowing through transistor M1A, load device M2R serving to replicate transistor M2A, and current source M6R serving to replicate current source M6. Furthermore, transistors M3R and M5R serve to replicate transistors M3A and M3B of common mode feedback circuit 701.

By applying a substrate voltage to transistor M4A which is equal to the voltage on inverting output lead 113, the on resistance $R_{on}$ of transistor M4A is minimized. It is well known that the resistance of an MOS transistor is defined:

$$R_{on} = \frac{1}{\beta\left(\frac{W}{L}\right)[V_{gs} - V_T - V_{ds}]} ; \text{where} \quad (10)$$

$R_{on} = $ the on resistance of an MOS transistor such as transistor M4A;
$\beta = $ a process dependent constants, -continued
W = the channel width of the transistor;
L = the channel length of the transistor;
$V_{gs}$ = the gate to source voltage of the transistor;
$V_T$ = is the threshold voltage of the transistor; and
$V_{ds}$ = the drain to source voltage of the transistor.

Ron =1
; where (10)
[Vgs - VT - Vds]
Ron the on resistance of an MOS
transistor such as transistor M4A;
a process dependent constants; W the channel width of the transistor; L the channel length of the transistor; Vgs the gate to source voltage of the
transistor; VT is the threshold voltage of the transistor; and Vds the drain to source voltage of the transistor.

Since β is process dependent, the width and the length of the transistor channel are dictated by minimum geometries and current carrying requirements, and $V_{gs}$ and $V_{ds}$ are dictated by design constraints and desired operating conditions, $V_T$ is minimized in accordance with the teachings of this invention without the need to alter either β, $$\left(\frac{W}{L}\right),$$

VGS, or VDS. It is well known that for a MOS transistor, the threshold voltage is defined as $$V_T = V_{TO} + M[(V_{BS}+2\phi)^{\frac{1}{2}} - (2\phi)^{\frac{1}{2}}]; \text{ where} \quad (11)$$

$V_{TO}$ = the theoretical lowest possible threshold voltage for the device;

M = a process dependent constant;

$V_{BS}$ = the voltage between the bulk and the source; and $\phi$ = the potential associated with N type (or P type) silicon (typically 0.6 volts)

1/2 - (2)1/2]; where (11) VT =VTO +M (VBS +2)
VTO the theoretical lowest possible
threshold voltage for the device; M a process dependent constant; VBS the voltage between the bulk and the
source; and
the potential associated with N type
(or P type) silicon (typically 0.6
volts)

Since, as previously described, in accordance with the teachings of the present invention, the voltage applied to the bulk or substrate of transistor M4A is equal to the output voltage on inverting output lead 113 which is connected to the source of transistor M4A, $V_{BS}$ equals zero and thus, from equation 11, $V_T$ approaches $V_{TO}$. With $V_T$ as low as possible, from equation 10, $R_{on}$ becomes as low as possible. Thus, since $R_{on}$ of transistor M4A is made quite low by minimizing the threshold voltage $V_T$, the ratio W/L of the channel width to channel length of transistor M4A need not be made large in an attempt to reduce $R_{on}$, thereby obviating the need to undesirably increase the overlapped gate-to-source capacitance of transistor M4A and its associated increase in charge injection.

Furthermore, in accordance with the teachings of this invention, the need for source follower M3A (FIG. 2) is obviated since the voltage swing on nodes 113 and 114 are more precisely controlled, e.g. by the limiting action of transistors 711A and 711B. This reduces integrated circuit die size, and in turn increases yield and reduces cost. In addition, without requiring source follower M3A, power consumption of the device is reduced.

In accordance with the teaching of this invention, comparator 700 during the auto-zero cycle of operation has a dominant pole $$P_d = \frac{-1}{C_{1A}R_{out}};$$

where
$R_{out}$ is as previously defined; and $$C_{1A} = C_{125} + C_{jdbM1A} + C_{jdbM2A} + C_{jsbM4A}$$

and only one non-dominant pole $$P_{nd} = \frac{-1}{C_{2A}R_{onM4A}};$$

Pnd =C ;
where $$C_{2A} = C_{115} + C_{jdbM4A} + C_{gM2A}.$$

This is an improvement over the prior art structure of FIG. 2 which had two non-dominant poles.

In accordance with one embodiment of this invention, the following device sizes are used for the components shown in FIG. 3, with each unit of width and length being an arbitrary unit measurement for the purposes of showing relative sizes.

| Device Sizes | W/L |
| --- | --- |
| M1A, M1B | 128/10 |
| M2A, M2B | 250/10 |
| M3A, M3B | 60/10 |
| M5 | 10/10 |
| M6 | 300/10 |
| M1R | 64/10 |
| M2R | 125/10 |
| M3R | 40/10 |
| M5R | 10/30 |
| M6R | 150/10 |
| M4A, M4B | 36/5 |

Device Sizes W/L M1A, M1B 128/10 M2A, M2B 250/10 M3A, M3B 60/10 M5 10/10 M6 300/10 M1R 64/10 M2R 125/10 M3R 40/10 M5R 10/30 M6R 150/10 M4A, M4B 36/5

All publications and patent applications cited in this specification are herein incorporated by reference as if each individual publication or patent application were specifically and individually indicated to be incorporated by reference.

Although the foregoing invention has been described in some detail by way of illustration and example for purposes of clarity of understanding, it will be readily apparent to those of ordinary skill in the art in light of the teachings of this invention that certain changes and modifications may be made thereto without departing from the spirit or scope of the appended claims.

What is claimed is:

1. A comparator circuit comprising:
a first voltage supply terminal;
a second voltage supply terminal;
a first current source having a current source terminal referenced to said second voltage supply;
an inverting input leg comprising:

an inverting input transistor having an inverting input lead, a first current handling terminal connected to said current source terminal, and a second current handling terminal serving as a non-inverting output terminal; and a first load device connected between said first voltage supply terminal and said second current handling terminal of said inverting input transistor;

a non-inverting input leg comprising:

a non-inverting input transistor having a non-inverting input lead, a first current handling terminal connected to said current source terminal, and a second current handling terminal serving as an inverting output terminal; and a second load device connected between said first voltage supply terminal and said second current handling terminal of said non-inverting input transistor;

a first transmission gate comprising a first MOS transistor having a first current handling terminal connected to said inverting input lead, a second current handling terminal connected to said non-inverting output lead, a control terminal for receiving a control signal defining when said first MOS transistor is to be turned on, and a bulk terminal connected to the bulk of said first MOS transistor;

a second transmission gate comprising a second MOS transistor having a first current handling terminal connected to said non-inverting input lead, a second current handling terminal connected to said inverting output lead, a control terminal for receiving a control signal defining when said second MOS transistor is to be turned on, and a bulk terminal connected to the bulk of said second MOS transistor; and replica bias means for providing a replica bias voltage to said first and second bulk terminals, said replica bias voltage being substantially equal to the voltage on said inverting and non-inverting input leads when said first and second transmission gates are conducting.

2. A circuit as in claim 1 wherein said replica bias means comprises:

a third load device replicating said first and second load devices, having a first lead connected to said first voltage supply terminal, and having a second lead;

a second current source replicating said first current source; and a fourth load device replicating said inverting and non-inverting input transistors, connected between said second lead of said third load device and said second current source.

3. A circuit as in claim 1 wherein said inverting output terminal provides an inverting output voltage and said non-inverting output terminal provides a non-inverting output voltage, which further comprises a common mode feedback circuit comprising:

a second current source connected such that said first current source mirrors the current provided by said second current source;

a first means connected between said inverting output terminal and said second current source; and a second means connected between said non-inverting output terminal and said second current source, wherein a desired quiescent operating point for the inverting and non-inverting output voltages is maintained.

4. A circuit as in claim 3 wherein said replica bias means comprises:

a third load device replicating said first and second load devices, having a first lead connected to said first voltage supply terminal, and having a second lead;

a third current source replicating said first current source;

a fourth current source replicating said second current source;

a fourth load device, replicating said inverting and non-inverting input transistors, connected between said second lead of said third load device and said third current source; and a third means replicating said first and second means of said common mode feedback circuit.

* * * * *